(12) United States Patent
Moon et al.

(10) Patent No.: US 6,759,748 B2
(45) Date of Patent: Jul. 6, 2004

(54) WIRING STRUCTURE OF SEMICONDUCTOR DEVICE

(75) Inventors: Jae-hwan Moon, Suwon (KR); Gyu-chul Kim, Sungnam (KR)

(73) Assignee: Samsung Electronics Co., Ltd. (KR)

( * ) Notice: Subject to any disclaimer, the term of this patent is extended or adjusted under 35 U.S.C. 154(b) by 197 days.

(21) Appl. No.: 10/006,303

(22) Filed: Dec. 6, 2001

(65) Prior Publication Data

US 2002/0053687 A1 May 9, 2002

Related U.S. Application Data

(62) Division of application No. 09/359,243, filed on Jul. 22, 1999, now Pat. No. 6,355,515.

(30) Foreign Application Priority Data

Jul. 22, 1998 (KR) ............................................. 98-29525

(51) Int. Cl.[7] .................. H01L 29/739; H01L 29/74; H01L 29/40; H01L 23/48; H01L 23/52
(52) U.S. Cl. .................. 257/758; 257/763; 257/748; 257/741; 257/211; 257/202
(58) Field of Search .................. 257/202, 741, 257/748, 758, 763, 211

(56) References Cited

U.S. PATENT DOCUMENTS

| | | | | |
|---|---|---|---|---|
| 6,025,277 A | * | 2/2000 | Chen et al. | 438/738 |
| 6,080,664 A | * | 6/2000 | Huang et al. | 438/638 |
| 6,274,409 B1 | * | 8/2001 | Choi | 438/128 |
| 6,548,853 B1 | * | 4/2003 | Hwang et al. | 257/306 |
| 6,627,528 B1 | * | 9/2003 | Ishimaru | 438/596 |

* cited by examiner

Primary Examiner—Nathan J. Flynn
Assistant Examiner—Victor A. Mandala, Jr.
(74) Attorney, Agent, or Firm—Cantor Colburn LLP

(57) ABSTRACT

A wiring structure of a semiconductor device and a method for manufacturing the same are provided. The wiring structure according to the present invention includes a body formed of a first conductive material in a first insulating film on a semiconductor substrate and a protrusion formed of a second conductive material in a second insulating film formed on the first insulating film, connected to the upper surface of the body, formed to have a width less than that of the body, and having a planarized upper surface.

14 Claims, 4 Drawing Sheets

WIRING STRUCTURE OF SEMICONDUCTOR DEVICE

CROSS REFERENCE TO RELATED APPLICATIONS

This application is a divisional application of U.S. Pat. Ser. No. 09/359,243, filed on Jul. 22, 1999 now U.S. Pat. No. 6,355,515, which is herein incorporated by reference in its entirety.

BACKGROUND OF THE INVENTION

1. Field of the Invention

The present invention relates to a semiconductor device, and more particularly, to a wiring structure of a semiconductor device and a method for manufacturing the same.

2. Description of the Related Art

As semiconductor devices become more highly integrated or the speed thereof increases, a multi-layer wiring structure is required. Accordingly, it is important to secure an alignment margin in a photolithography process for reducing the pitch of metal wiring or succeeding wiring. It is necessary to increase the flatness of an insulating film for insulating the metal wiring in order to reduce the pitch of the metal wiring or to secure the alignment margin.

A process of planarizing the insulating film is necessary for increasing the flatness of the insulating film. For example, one such exemplary process comprises a method of forming an insulating film and polishing the insulating film globally by a chemical mechanical polishing (CMP) method. The process of planarizing the insulating film using the CMP method is essential for securing a processing margin and process stabilizing in manufacturing a multi-layer wiring structure.

FIG. 1 schematically shows a sectional view of the wiring structure of a conventional semiconductor device.

To be specific, the conventional wiring structure will be described, taking a static random access memory (SRAM) device in which the CMP method is used as a planarizing method, as an example. A first insulating film 31 insulates a lower structure such as a drain or source region 15 formed on a semiconductor substrate 10, a gate electrode 23, and a $V_{CC}$ line 40 from the metal wiring, for example, a first wiring 61. The first insulating film 31 is planarized by the CMP method in order to increase the flatness.

A groove of a second insulating film 35 formed on the first insulating film 31 is filled with the first wiring 61. Namely, the first wiring 61 is formed by a damascene process. A conductive stud 63 formed in a contact hole through the second insulating film 35 and the first insulating film 31 contacts the drain or source area 15. The first wiring 61 and the stud 63 are formed by filling the groove or the contact hole with a conductive film and polishing the conductive film by the CMP method. It is essential for securing the processing margin or the multi-layer wiring structure in a succeeding process to form the first wiring 61 or the conductive stud 63 by planarizing the conductive film by the CMP method.

However, the conductive film may be over polished when it is polished by the CMP method and the first wiring 61 or the conductive stud 63 can be excessively etched by this over polishing phenomenon. The first wiring 61 operates as a word line or a $V_{SS}$ line in the semiconductor device. Therefore, the excessive etching can reduce the cross sectional area of the first wiring 61, thus increasing the resistance of the first wiring 61 or cause a short of the first wiring 61. The increase of the resistance of the first wiring 61 can decrease the operating speed of the semiconductor device or cause misoperation of the semiconductor device. The conductive stud 63 is connected to second wiring formed on the first wiring 61.

SUMMARY OF THE INVENTION

To solve the above problem, it is an objective of the present invention to provide a wiring structure of a semiconductor device in which it is possible to prevent an increase in the resistance of the wiring or a short in the wiring by preventing the wiring from being excessively etched when a planarizing method such as a CMP method is used.

It is another objective of the present invention to provide a method for manufacturing the wiring structure of the semiconductor device by which it is possible to prevent the increase in the resistance of the wiring or the short in the wiring by preventing the wiring from being excessively etched when a planarizing method such as a CMP method is used.

Accordingly, to achieve the first objective, there is provided a wiring structure of a semiconductor device, comprising a body and a protrusion, formed of a conductive material in a first insulating film on a semiconductor substrate. The body is preferably a polygonal column or a hemispherical column. The protrusion is formed of a conductive material in a second insulating film formed on the first insulating film and connected to the upper surface of the body The protrusion is formed to have a width narrower than that of the body, and has a planarized upper surface.

The first insulating film is formed of a material having an etching rate greater than that of the second insulating film. A conductive stud insulated from the wiring by the first insulating film and the second insulating film, connected to the semiconductor substrate, and having a planarized surface having the same height as the planarized surface of the wiring is further comprised.

The conductive material is one selected from a group consisting of tungsten, aluminum, tungsten alloy, and aluminum alloy. The wiring structure can be applied to a semiconductor device such as an SRAM device. At this time, the wiring is used as a $V_{SS}$ line or a word line.

To achieve the second objective, there is provided a method for manufacturing the wiring structure of a semiconductor device. In the method, a first insulating film is formed on a semiconductor substrate. A second insulating film having an etching ratio less than that of the first insulating film is formed on the first insulating film. A second insulating film pattern having an aperture exposing some of the surface of the first insulating film is formed by patterning the second insulating film. A trench having a width greater than the width exposed by the aperture is formed by patterning some of the first insulating film exposed by the aperture. A conductive film for filling the trench and the aperture is formed on the second insulating film pattern. A protrusion and a body having a width greater than the width of the protrusion are respectively formed in the aperture and in the trench by planarizing the conductive film.

In forming the trench, a trench having a width greater than the width exposed by the aperture is formed by performing a dry etching or a wet etching process in a condition in which the etching rate of the first insulating film is greater than that of the second insulating film pattern. In forming the conductive film, the conductive film is preferably formed of a material selected from a group consisting of tungsten, aluminum, tungsten alloy, and aluminum alloy.

The forming of a contact hole exposing some of the semiconductor substrate by sequentially patterning the second insulating film pattern and the first insulating film is further comprised before forming the conductive film. The contact hole is filled together with the trench and the aperture in the step of forming the conductive film. A conductive stud is formed in the contact hole by planarizing the conductive film filling the contact hole in the planarizing of the conductive film. The conductive film is polished by a chemical mechanical polishing (CMP) method in the planarizing of the conductive film.

Such a wiring structure can be applied to a semiconductor device such as an SRAM device. At this time, the wiring is used as a $V_{SS}$ line or a word line.

According to the present invention, it is possible to prevent the excessive etching of the wiring and to pattern the wiring using a planarizing method such as the CMP method. Accordingly, it is possible to prevent the increase in the resistance of the wiring or the short in the wiring. Also, it is possible to use a multi-layer wiring structure, to secure a succeeding process margin, and stabilize a process.

BRIEF DESCRIPTION OF THE DRAWING(S)

The above objectives and advantages of the present invention will become more apparent by describing in detail a preferred embodiment thereof with reference to the attached drawings in which.

DESCRIPTION OF THE PREFERRED EMBODIMENT(S)

Figure 1:
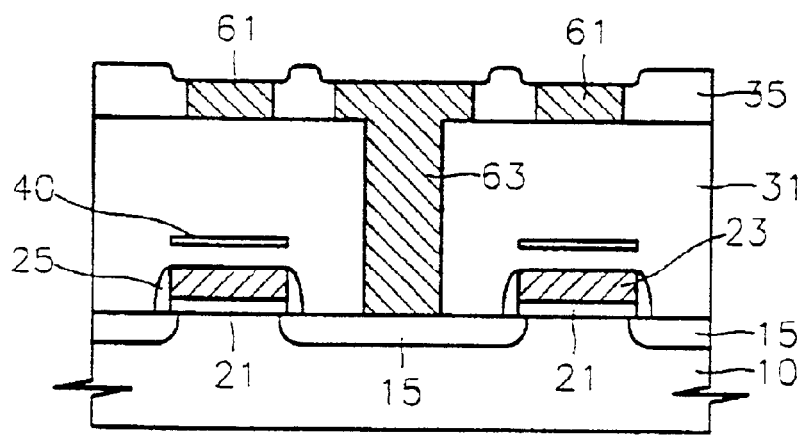
FIG. 1 is a sectional view for illustrating the wiring structure of a conventional semiconductor device.

Hereinafter, embodiments of the present invention will be described in detail with reference to the attached drawings. The present invention is not restricted to the exemplary embodiments which will be provided hereinafter and has many variations within the scope of the present invention. The present embodiments are provided to make the present invention complete and to completely inform to anyone skilled in the art the scope of the present invention. Therefore, the thickness of a film is exaggerated in order to emphasize correct explanation. Members denoted by the same references in the drawings are the same members. Also, when a certain film is "on" or contacts another film or a semiconductor substrate, the certain film may directly contact the other film or the semiconductor substrate, or a third film may be interposed therebetween.

The wiring structure of an SRAM device according to a first embodiment of the present invention will be described with reference to FIG. 2 in which a cross section of the SRAM device is shown. However, the present invention is not restricted to this embodiment. The present invention can be applied to various integrated circuits in which a multi-layer wiring structure is used.

To be specific, the wiring structure according to the first embodiment of the present invention has a first wiring 610 comprises a protrusion 610p formed on a body 610b to have a width less than that of the body 610b, and wherein an upper surface of protrusion 610p is planarized. The first wiring 610 can operate as a $V_{SS}$ line or a word line of the SRAM device. Therefore, though not shown in FIG. 2, the first wiring 610 is electrically connected to a gate electrode 230 or an active region 150 of a semiconductor substrate 100 by a conductive contact. Namely, the first wiring 610 is connected to the gate electrode 230 and is used as the word line or is connected to the active region 150 of the semiconductor substrate 100 and is used as the $V_{SS}$ line.

The first wiring 610 is separated from the lower semiconductor substrate 100, the gate electrode 230, and a $V_{CC}$ line 400 by a fist insulating film 330 and is insulated. The first insulating film 330 is formed of an insulating film such as silicon oxide and is planarized by the planarizing method such as the CMP method. Also, the first insulating film 330 insulates the body 610b of the first wiring 610. For example, the first insulating film 330 insulates side and lower portions of the body 610b.

A second insulating film pattern 355 is formed on an upper portion of the first insulating film 330. The second insulating film pattern 355 covers a side portion of the protrusion 610p of the first wiring 610 and some of the upper surface of the body 610b and exposes the planarized upper surface of the protrusion 610p. Accordingly, the exposure of the first wiring 610 is restricted to the upper surface of the protrusion 610p.

Also, the second insulating film pattern 355 is formed of an insulating material having an etching selectivity with respect to the first insulating film 330. For example, when the first insulating film 330 is formed of silicon oxide, the second insulating film 355 is formed of silicon nitride. It is possible to selectively etch the silicon oxide since the silicon nitride has a lower etching rate than the silicon oxide. Therefore, it is possible to form the first wiring 610 having the body 610b and the protrusion 610p as mentioned above by selectively etching the first insulating film 330.

Figure 2:
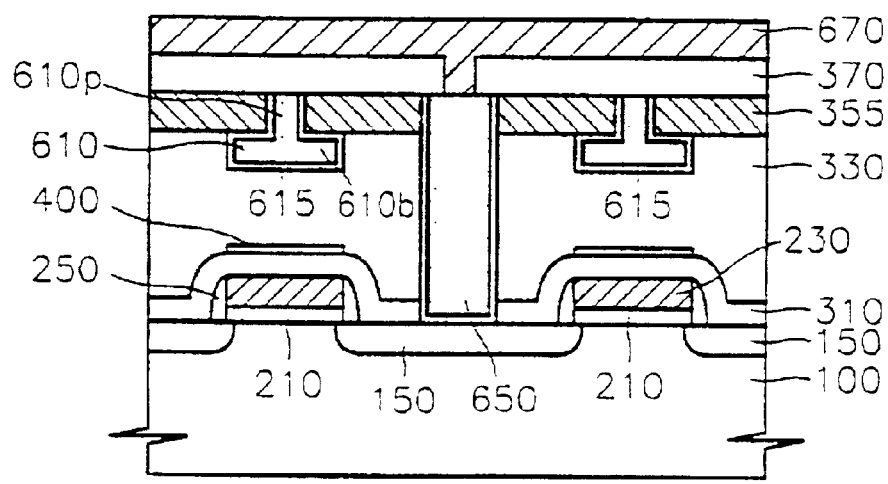
FIG. 2 is a sectional view for illustrating the wiring structure of an SRAM device according to a first embodiment of the present invention.

In FIG. 2, the body 610b of the first wiring 610 is a polygonal column having a square cross section. Such a shape is obtained by forming a trench so that the edges and corners have uniform angles by selectively dry etching the first insulating film 330.

As the multi-layer wiring structure is introduced, a process of forming a second wiring 670 as an upper structure of the first wiring 610 is required. At this time, the second wiring 670 is connected to the active region 150 such as the drain or source region of the semiconductor substrate 100 by a conductive stud 650.

As semiconductor devices become more highly integrated or the speed thereof increases, it is necessary to secure a processing margin or to stabilize a following process such as a process of forming the second wiring 670. Therefore, the surface of the resulting structure in which the first wiring 610 and the second insulating film pattern 355 are formed should have a high flatness in order to secure the process margin or to stabilize the following process.

Accordingly, a planarizing process such as the CMP method is used for patterning the first wiring 610 in order to realize the high flatness. For example, a conductive film is formed on the entire surface of the second insulating film pattern 355. Then, the conductive film is globally polished by the CMP method. At this time, an upper surface of the second insulating film pattern 355 is used as the end point of polishing. It is possible to realize a surface having a high flatness and to form the first wiring 610 by global polishing using a planarizing process, for example, the CMP method.

At this time, in the embodiment according to the present invention, only the upper surface of the protrusion 610p of the first wiring 610 is polished by the CMP method. The remaining upper surface of the first wiring 610, i.e., the upper surface of the body 610b, is covered by the second insulating film pattern 355. The second insulating film pattern 355 thus protects the body 610b from polishing using the CMP method.

Only some of the upper surface of the first wiring 610 having the wiring structure according to the embodiment of the present invention is planarized by the planarizing method such as the CMP method. Therefore, the excessively etched area is negligible though the phenomenon of over polishing is generated. Since the excessively etched area is negligible, the reduction of the sectional area of the first wiring 610 due to over polishing is negligible.

Therefore, it is possible to prevent the reduction of the sectional area of the first wiring 610 due to over polishing. Accordingly, it is possible to prevent an increase in resistance or a short. Furthermore, it is possible to increase the overall flatness since it is possible to reduce the area in which the first wiring 610 is exposed. Accordingly, it is possible to secure the process margin of the succeeding process for forming the second wiring 670 on the first wiring 610. Also, it is possible to stabilize the succeeding process.

A method for manufacturing the wiring structure of the SRAM device according to the first embodiment of the present invention will now be described with reference to FIGS. 3 through 8.

Figure 3:
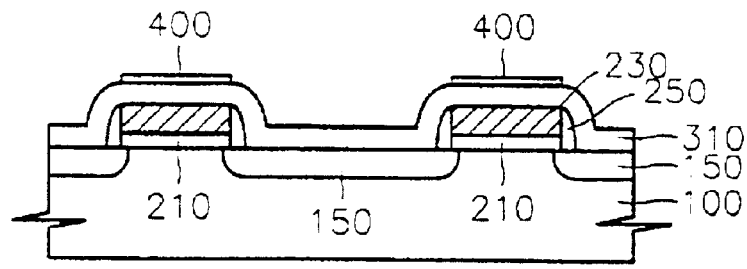
FIGS. 3 through 8 are sectional views for illustrating a method for manufacturing the wiring structure of an SRAM device according to the first embodiment of the present invention.

Referring to FIG. 3, an N* or P* active region 150 is formed on a semiconductor substrate 100. The active region 150 is used as a drain or source region having a MOS transistor structure. Then, a gate oxide film 210, a gate electrode 230, and a spacer 250 are formed.

An interlayer dielectric film 310 for insulating the gate electrode 230 is formed. A conductive material such as polycrystalline silicon doped with impurities is deposited on the interlayer dielectric film 310 and is patterned by a photolithography process, thus forming a $V_{CO}$ line 400.

Figure 4:
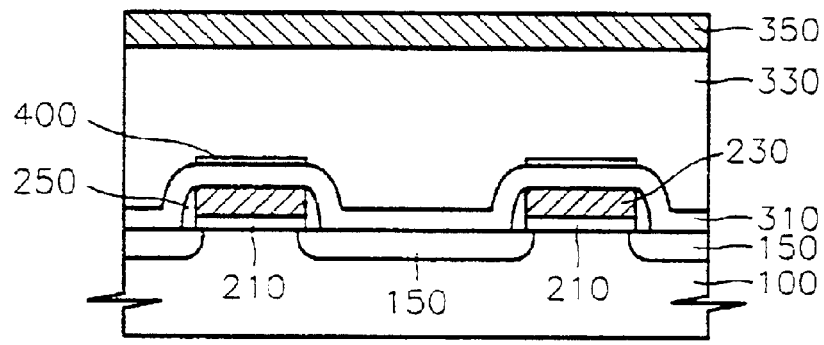

Referring to FIG. 4, a first insulating film 330 for covering and insulating the $V_{OC}$ line is formed. For example, the first insulating film 330 is formed using an insulating material such as silicon oxide. Then, the first insulating film 330 is planarized by the CMP method in order to secure the process margin of the succeeding process or to stabilize the process.

Then, a second insulating film 350 is formed of an insulating material having an etching rate lower than that of the first insulating film 330 on the planarized first insulating film 330. For example, the first insulating film 330 is formed of silicon oxide and the second insulating film 350 is formed of silicon nitride.

Figure 5:
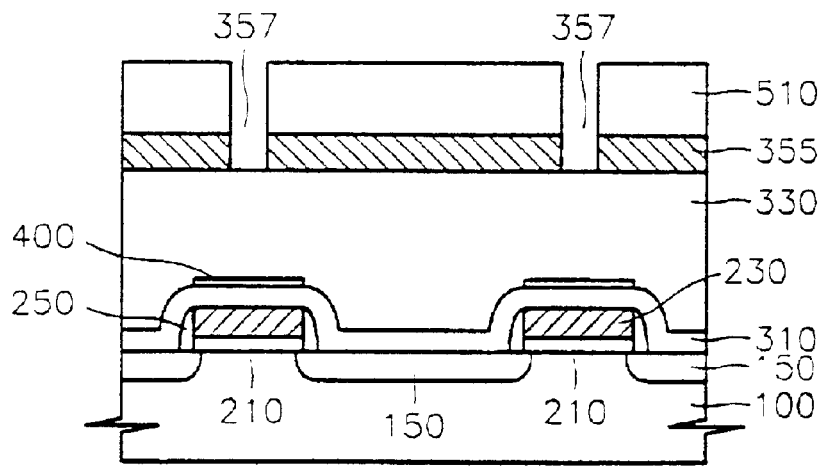

Referring to FIG. 5, a second insulating film pattern 355 including an aperture 357 exposing some of the surface of the lower first insulating film 330 is formed by patterning the second insulating film 350 by a photolithography process using a first photoresist pattern 510. At this time, the aperture 357 is formed to have a width less than the maximum width of the base of the first wiring 610 of FIG. 2.

Figure 6:
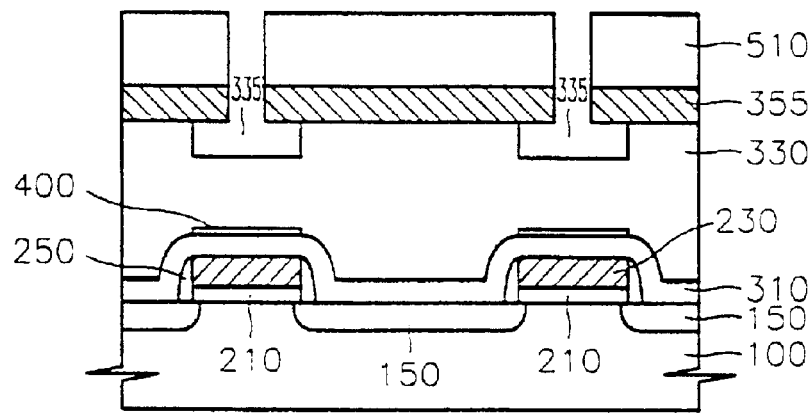

Referring to FIG. 6, a trench 335 is formed by etching some of the first insulating film 330 exposed by the aperture 357. At this time, the etching process is performed by a dry etching method in which the etching is performed not only in a vertical direction but also in a horizontal direction. Accordingly, the corners and the edges of the trench 335 form a uniform angle, for example, an angle of 90°. The trench 335 can have corners and edges forming various angles according to the conditions of the dry etching.

At this time, the etching process is performed in a condition in which the etching selectivity of the first insulating film 330 with respect to the second insulating film pattern 355 is large. For example, when the first insulating film 330 is formed of silicon oxide as mentioned above, the second insulating film pattern 355 is formed of silicon nitride. Accordingly, it is possible to maintain the amount of etching of the second insulating film pattern 355 to be negligible during the formation of the trench 355 by the photolithography process.

The trench 335 formed by the process of selectively etching the first insulating film 330 has a width wider than that of the aperture 357 of the second insulating film pattern 355. For example, the width or the depth of the trench 335 is determined considering the resistance of the wiring required for the semiconductor device. For example, the trench 335 is formed to have the depth of about 4,000 Å. Also, some of the second insulating film pattern 355 covers the upper portion of the trench 335. The upper portion corresponding to the width of the aperture 357 is exposed. Namely, the second insulating film pattern 355 is positioned such that a cover is installed on the trench 335.

Figure 7:
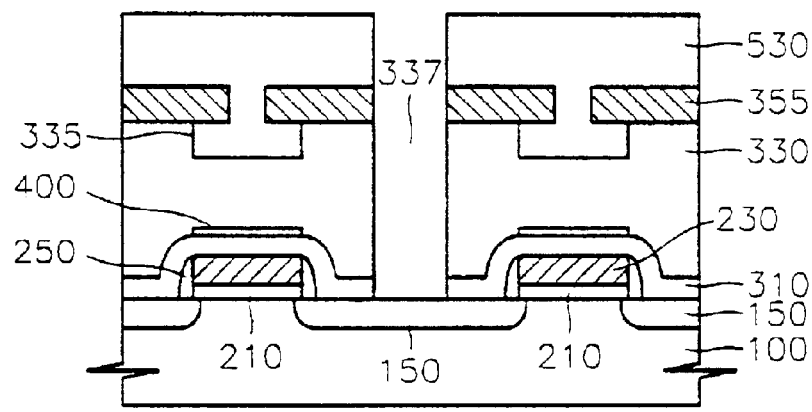

Referring to FIG. 7, a contact hole 337 for exposing the active region 150 of the semiconductor substrate 100 is formed by patterning the second insulating film pattern 355, the first insulating film pattern 330, and the interlayer dielectric film 310 by a photolithography process using a second photoresist pattern 530.

Figure 8:
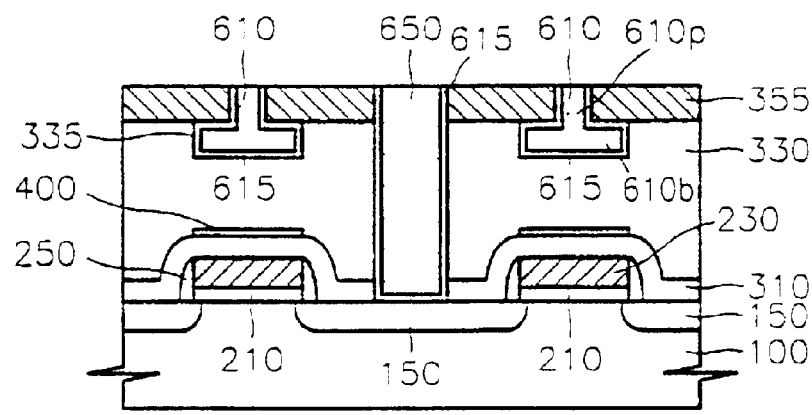

Referring to FIG. 8, a conductive film filling the trench 335, the aperture 357, and the contact hole 337 is formed on the second insulating film pattern 355. Since the conductive film is used as the wiring of the semiconductor device, it is formed of a metal or a conductive material such as tungsten or aluminum. At this time, the conductive film is formed by a deposition method in which the conductive film can be deposited in a horizontal direction so as to laterally fill the base of the trench 335 through the aperture 357 having a narrow width. For example, the conductive film is formed by a chemical vapor deposition (CVD) method.

A barrier layer 615 can be formed on an inner surface of the trench 335, the aperture 357, and the contact hole 337 before forming the conductive film. The barrier layer 615 can be formed of a titanium film, a titanium nitride film, or a double film formed of the titanium film and the titanium nitride film. At this time, the titanium film and the titanium nitride film are formed to have thicknesses of about 900 Å and 600 Å, respectively. The barrier film 615 improves an intersurface characteristic between the conductive film and the first insulating film 330, the second insulating film pattern 355, and the active region 150 of the semiconductor substrate 100.

Then, the entire surface of the conductive film is planarized. For example, the entire surface of the conductive film is polished by the CMP method. At this time, the upper surface of the second insulating film pattern 355 is used as the end point for polishing using the CMP method. Accordingly, the first wiring 610 filling the trench 335 and the aperture 357, and the conductive stud 650 filling the contact hole 337 are completed.

Since the planarizing process is performed by the CMP method, the surface of the resulting structure in which the first wiring 610 is formed, is highly flat. Accordingly, it is possible to secure the process margin or to stabilize the process of forming the second wiring 670 as shown in FIG. 2.

The upper surface of the first wiring 610 having a width less than the width of the body 610b, which fills the trench 355, is exposed. Some of the upper surface of the body 610b is covered by the second insulating film pattern 355 and is protected from the planarizing process. Only the part of the wiring which fills the aperture 357 connected to the body 610b, i.e., only the upper surface of the protrusion 610p, is exposed.

Therefore, only the upper surface of the protrusion 610p which is some part which fills the aperture 357 is exposed to the CMP process. Accordingly, the area of the first wiring 610 polished by the CMP method becomes smaller than in a conventional technology.

Since an excessive amount of excessive etching caused by over polishing is proportional to a polished area, it is possible to prevent the first wiring 610 from being excessively etched by over polishing by the CMP method. Namely, the upper surface of the exposed protrusion 610p has a width less than the entire width of the body 610b. Therefore, the amount of first wiring 610 etched by excessive etching is negligible. Therefore, it is possible to prevent an increase in resistance or short of the first wiring 610.

After forming the first wiring 610 or the conductive stud 650, a third insulating film for covering the first wiring 610 is formed. Then, the third insulating film pattern 370 of FIG. 2 for exposing the conductive stud 650 is formed by patterning the third insulating film. Then, the wiring structure shown in FIG. 2 is completed by forming the second wiring 670 connected to the conductive stud 650.

Figure 9:
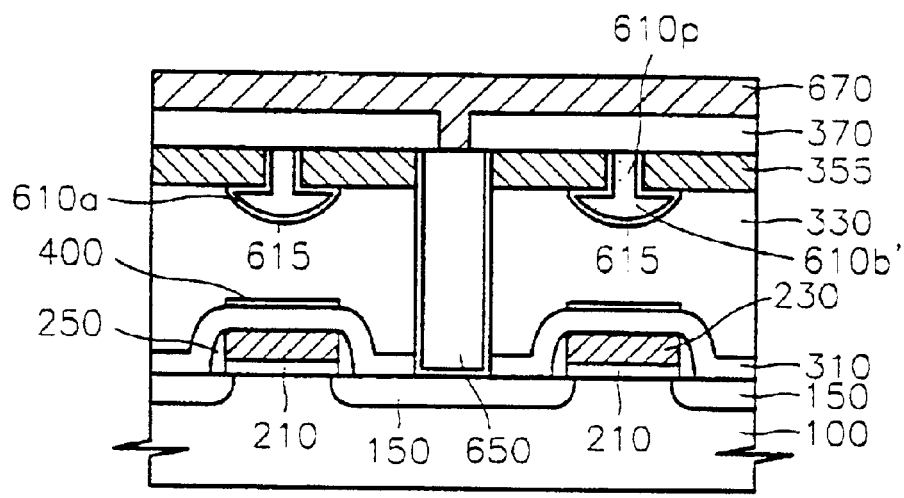
FIG. 9 is a sectional view for illustrating the wiring structure of the SRAM device according to a second embodiment of the present invention.

The wiring structure of the SRAM device according to a second embodiment of the present invention is described with reference to FIG. 9. The second embodiment is different from the first embodiment only in that the bottom of the body 610b' of a first wiring 610a is curved. Such a shape can be obtained by selectively wet etching the first insulating film 330.

A method of manufacturing the wiring structure of the SRAM device according to the second embodiment of the present invention will be now described with reference to FIG. 10.

Figure 10:
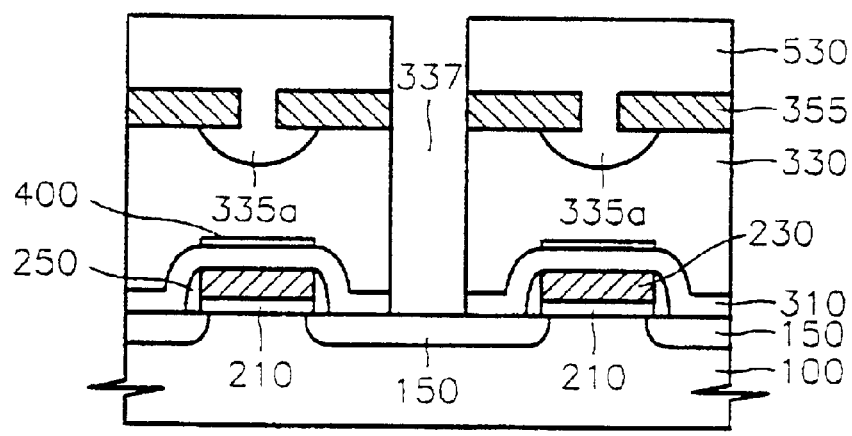
FIG. 10 is a sectional view for illustrating a method for manufacturing the wiring structure of the SRAM device according to the second embodiment of the present invention.

Referring to FIG. 10, the method of manufacturing the wiring structure of the SRAM device according to the second embodiment is different from the method of manufacturing the wiring structure of the SRAM device according to the first embodiment in that a process of forming a trench 355a is performed by a selective wet etching method. Accordingly, the trench 355a having a curved bottom is formed. This is due to the isotropic etching characteristic of the wet etching method. Other processes can proceed in the same way as the method of manufacturing the wiring structure of the SRAM device according to the first embodiment. As a result, the wiring structure shown in FIG. 9 can be formed.

It is possible to prevent an increase in resistance or generation of a short of the wiring caused by the over polishing or the excessive etching during a planarizing process such as the CMP method, with the wiring structure according to the second embodiment of the present invention like in the first embodiment. Therefore, it is possible to secure the process margin of a succeeding process such as the upper wiring process, since it is possible to stabilize a planarizing process such the CMP method.

The present invention is not restricted to the above embodiments, and it is clearly understood that many variations are possible within the scope and spirit of the present invention by anyone skilled in the art.

What is claimed is:

1. A wiring structure of a semiconductor device, comprising:
   a body formed of a first conductive material in a first insulating film on a semiconductor substrate; and
   a protrusion formed of a second conductive material in a second insulating film formed on the first insulating film, the protrusion being connected to an upper surface of the body and formed to have a width less than a width of the body, and including a planarized upper surface;
   wherein the semiconductor device is an SRAM device and the wiring is a $V_{SS}$ line or a word line.

2. The wiring structure of claim 1, wherein the body has a shape of a polygonal column.

3. The wiring structure of claim 1, wherein the body has a shape of a hemispherical column.

4. The wiring structure of claim 1, wherein the first conductive material is one selected from a group consisting of tungsten, aluminum, tungsten alloy, and aluminum alloy.

5. The wiring structure of claim 1, wherein the second conductive material is one selected from a group consisting of tungsten, aluminum, tungsten alloy, and aluminum alloy.

6. The wiring structure of claim 1, wherein the first insulating film is formed of a material having an etching rate greater than that of the second insulating film.

7. The wiring structure of claim 1, further comprising a conductive stud insulated from the wiring by the first insulating film and the second insulating film, connected to the semiconductor substrate, and having a planarized surface having the same height as the planarized surface of the wiring.

8. A wiring structure of a semiconductor device, comprising:
   a body formed of a first conductive material in a first insulating film on a semiconductor substrate;
   a protrusion formed of a second conductive material in a second insulating film formed on the first insulating film, the protrusion being connected to an upper surface of the body and formed to have a width less than a width of the body, and including a planarized upper surface; and
   a conductive stud insulated from the wiring by the first insulating film and the second insulating film, connected to the semiconductor substrate, and having a planarized surface having the same height as the planarized surface of the wiring.

9. The wiring structure of claim 8, wherein the body has a shape of a polygonal column.

10. The wiring structure of claim 8, wherein the body has a shape of a hemispherical column.

11. The wiring structure of claim 8, wherein the first conductive material is one selected from a group consisting of tungsten, aluminum, tungsten alloy, and aluminum alloy.

12. The wiring structure of claim 8, wherein the second conductive material is one selected from a group consisting of tungsten, aluminum, tungsten alloy, and aluminum alloy.

13. The wiring structure of claim 8, wherein the semiconductor device is an SRAM device and the wiring is a $V_{ss}$ line or a word line.

14. The wiring structure of claim 8, wherein the first insulating film is formed of a material having an etching rate greater than that of the second insulating film.

* * * * *